United States Patent
Lin et al.

(10) Patent No.: US 10,158,054 B1
(45) Date of Patent: Dec. 18, 2018

(54) LED LIGHTING DEVICE

(71) Applicant: UNITY OPTO TECHNOLOGY CO., LTD., New Taipei (TW)

(72) Inventors: Wei-Chung Lin, New Taipei (TW); Hung-Li Yeh, New Taipei (TW); Ko-Wei Lu, New Taipei (TW)

(73) Assignee: Unity Opto Technology Co., Ltd., New Taipei (TW)

( * ) Notice: Subject to any disclaimer, the term of this patent is extended or adjusted under 35 U.S.C. 154(b) by 0 days.

(21) Appl. No.: 15/725,700

(22) Filed: Oct. 5, 2017

(30) Foreign Application Priority Data

Jul. 13, 2017 (TW) .............................. 106123472 A

(51) Int. Cl.
| | |
|---|---|
| *H01L 33/50* | (2010.01) |
| *H01L 33/48* | (2010.01) |
| *H01L 33/56* | (2010.01) |
| *B82Y 20/00* | (2011.01) |

(52) U.S. Cl.
CPC .......... *H01L 33/504* (2013.01); *H01L 33/486* (2013.01); *H01L 33/508* (2013.01); *H01L 33/56* (2013.01); *B82Y 20/00* (2013.01); *H01L 2933/0083* (2013.01); *Y10S 977/774* (2013.01); *Y10S 977/818* (2013.01); *Y10S 977/824* (2013.01); *Y10S 977/825* (2013.01); *Y10S 977/95* (2013.01)

(58) Field of Classification Search
CPC ..... H01L 33/504; H01L 33/486; H01L 33/56; H01L 33/508; H01L 33/48; H01L 33/58; H01L 33/08; B82Y 20/00; Y10S 977/824; Y10S 977/818; Y10S 977/825; Y10S 977/774

USPC .............................................. 257/79, 88, 98
See application file for complete search history.

(56) References Cited

U.S. PATENT DOCUMENTS

| | | | | |
|---|---|---|---|---|
| 8,575,642 B1* | 11/2013 | Shum | ...................... | H01L 33/44 257/98 |
| 2004/0104391 A1* | 6/2004 | Maeda | ................. | C09K 11/025 257/79 |
| 2007/0075306 A1* | 4/2007 | Hayashi | ................ | H01L 33/641 257/13 |
| 2007/0259206 A1* | 11/2007 | Oshio | ................... | C04B 35/581 428/690 |
| 2011/0215348 A1* | 9/2011 | Trottier | ..................... | F21V 9/08 257/89 |
| 2012/0195340 A1* | 8/2012 | Cheon | .................. | H01L 33/501 372/50.1 |
| 2013/0026500 A1* | 1/2013 | Kim | ........................ | H01L 33/50 257/88 |
| 2013/0099213 A1* | 4/2013 | Jun | ........................ | C09K 11/02 257/40 |

(Continued)

FOREIGN PATENT DOCUMENTS

CN          105449074 A          3/2016

*Primary Examiner* — Alexander Oscar Williams
(74) *Attorney, Agent, or Firm* — Rosenberg, Klein & Lee

(57) ABSTRACT

An LED lighting device is disclosed. The LED lighting device uses a violet LED chip as a light source for exciting quantum dots. The quantum dots excited by the light of the violet LED chip are mixed with each other to form white light. So, the LED lighting device not just has the effects of providing a high luminous efficiency and preventing the blue light from damaging human eyes only, but also provides a better color rendering ability.

32 Claims, 12 Drawing Sheets
(3 of 12 Drawing Sheet(s) Filed in Color)

(56) References Cited

U.S. PATENT DOCUMENTS

| | | | |
|---|---|---|---|
| 2013/0293123 A1* | 11/2013 | Deak, Sr. | H05B 33/0803 |
| | | | 315/186 |
| 2014/0016661 A1* | 1/2014 | Orita | H01L 33/02 |
| | | | 372/50.1 |
| 2014/0034986 A1* | 2/2014 | Bradley, Jr. | H01L 33/60 |
| | | | 257/98 |
| 2015/0126221 A9* | 5/2015 | Cooper | G01C 21/26 |
| | | | 455/456.3 |
| 2015/0203747 A1* | 7/2015 | Haley | H01L 33/502 |
| | | | 257/98 |
| 2016/0049560 A1* | 2/2016 | Oh | H01L 33/504 |
| | | | 257/98 |
| 2017/0059129 A1* | 3/2017 | Li | G02F 1/1336 |
| 2017/0122502 A1* | 5/2017 | Cok | G09G 3/32 |
| 2017/0168204 A1* | 6/2017 | Zhang | G02F 1/1335 |

* cited by examiner

US 10,158,054 B1

LED LIGHTING DEVICE

CROSS-REFERENCE TO RELATED APPLICATIONS

This non-provisional application claims priority under 35 U.S.C. § 119(a) on Patent Application No(s). 106123472 filed in Taiwan, R.O.C. on Jul. 13, 2017, the entire contents of which are hereby incorporated by reference.

FIELD OF INVENTION

The present invention relates to the field of a light emitting diode (LED), in particular to an LED lighting device that provides high color rendering and light emitting efficiency by mixing violet light with excited quantum dots.

BACKGROUND OF INVENTION

1. Description of the Related Art

In the field of present white light illuminations, light emitting diode (LED) plays an important role, and the most extensively used conventional LED adopts a structure having a blue light LED chip together with a phosphor material to produce white light, and such white light LED is applied extensively in backlight modules and illumination lamps to serve as a main light source. The aforementioned white light LED adopts a blue light LED chip together with a green or yellowish green phosphor and a red phosphor, so that the phosphor absorbs blue light to be excited to form green light and red light. However, such white light LED has the drawbacks of poor light emitting efficiency and color rendering. As requirements become higher and higher, zero-dimensional semiconductor nano crystal (also known as quantum dot) is used to substitute fluorescent white light LED.

The quantum dot has properties falling within a range of blocks and independent molecules or atoms, such that when a material is in the size of a quantum dot, electrons may be excited easily to change the energy level and combined with holes to produce exited light, and the quantum dot has the optical property of a unique narrow spectrum, so that the quantum dot is started to be used in LED, solar cell and bio-lithography. The application of quantum dots on LEDs is substantially the same as phosphor capable of absorbing blue light from a blue light LED chip and emitting lights of other colors, so as to provide a required light color. With the narrow fluorescent spectrum of the quantum dot, the color rendering and light emitting efficiency of the LED can be improved significantly.

In view of the excellent optical properties of the quantum dots, a lighting device disclosed in P.R.C. Pat. No. 201510594156.1 uses a blue light emitting element together with a green quantum dot and a red phosphor, and a portion of blue light produced by the blue light emitting element is absorbed by the red phosphor and the green quantum dots and excited to produce a red light and a green light, and then the blue light produced by the blue light emitting element is mixed with the red light and the green light to form a white light. The literature further mentions the reason of abandoning the red quantum dots and keeping the use of red phosphor. In conventional lighting devices, the red quantum dots and the green quantum dots are used together with the blue light emitting element, and the lights are mixed to form a white light. However, the issue of a secondary absorption is found. In other words, the red quantum dots may absorb the green light produced by the green quantum dots, and such phenomenon affects the overall efficiency of the lighting device greatly.

In an independent use of the blue light emitting element as the excitation source of the LED, if the light emitting efficiency is the major consideration of the design, intuitively the aforementioned design will be adopted to increase the intensity of the blue light, so as to improve the overall light emitting efficiency, but such arrangement will create another issue of having a too high blue light intensity which may harm human eyes. To prevent the excessive blue light from harming users' eyes, it is necessary to reduce the intensity of the blue light emitting element using LED as the excitation source. As a result, the issue of poor light emitting efficiency of the LED arises again. Therefore, if the conventional LED designed is adopted, the aforementioned two advantages cannot be taken into consideration concurrently to maximize the performance. The basic structure of the LED lighting design is sacrificed in order to achieve effects of providing high luminous efficiency and preventing harming human eyes.

Therefore, how to overcome the drawback of the secondary absorption arisen from using the LED with quantum dots instead of phosphor by providing an LED of better light emitting efficiency and light color demands immediate attention and requires feasible solutions.

2. Summary of the Invention

Therefore, it is a primary objective of the present invention to overcome the drawbacks of the prior art by providing an LED lighting device that uses a violet light as an exciting light source and a quantum dot to substitute the phosphor as an exciting material, so that the LED lighting device has the effects of providing an excellent light emitting efficiency and preventing blue light from harming human eyes, and the LED lighting device also effectively overcomes the drawback of having a secondary absorption when the conventional LED lighting device adopts the quantum dot.

To achieve the aforementioned and other objectives, the present invention provides an LED lighting device, comprising: a base; a violet LED chip, installed at the base, for producing a violet light with a wavelength falling within a range of 320-415 nm; and a quantum dot excitation structure, configured to be corresponsive to the violet LED chip, for absorbing the violet light, and the quantum dot excitation structure including a first quantum dot, a second quantum dot and a third quantum dot, wherein the first quantum dot has a particle size greater than the second quantum dot, and the second quantum dot has a particle size greater than the third quantum dot, and the first quantum dot has a unit volume distribution density $D1$ smaller than the unit volume distribution density $D2$ of the second quantum dot, and the unit volume distribution density $D3$ of the third quantum dot, or $D1<D2$; $D1<D3$, and the first quantum dot and the violet LED chip have a relative distance $L1$ smaller than the relative distance of the second quantum dot and the violet LED chip, and the third quantum dot and the violet LED chip have a relative distance $L3$, or $L1<L2$; $L1<L3$, and after the first quantum dot absorbs a portion of the violet light, the exciting light has a wavelength falling within a range of 620-660 nm, and after the second quantum dot absorbs a portion of the violet light, the exciting light has a wavelength falling within a range of 510-540 nm, and after the third quantum dot absorbs a portion of the violet light, the exciting light has a wavelength falling within a range of 430-470 nm, and then the exciting lights are mixed to form a white light.

The first quantum dots are arranged closer to the violet LED than the second and third quantum dots from the violet LED, and the unit volume distribution density of the first quantum dot is smaller than those of the second and third quantum dots, so that the issue of the secondary absorption of light can be overcome effectively, and the LED lighting device using the violet light as an exciting light can improve the light emitting efficiency of the LED lighting device effectively, and can adjust the light intensity for exciting the third quantum dot freely, so as to protect human eyes from being harmed by the blue light and provide an excellent color rendering ability of the LED lighting device.

In an embodiment, the LED lighting device further comprises a colloid, for encapsulating the violet LED chip, and the first quantum dot is doped into the colloid, and the second quantum dot and the third quantum dot are disposed on an outer side of the colloid, and the colloid is provided for encapsulating and protecting the violet LED chip and the first quantum dot.

Wherein, the second quantum dot and the third quantum dot have a translucent isolating layer disposed adjacent to the colloid for isolating heat energy and facilitating light penetration in the operation of the violet LED chip.

Alternatively, the second quantum dot and the third quantum dot are sealed between two barrier layers to form a thin-film structure and disposed on a side of the violet LED chip, and provided for achieving the effect of protecting the second and third quantum dots.

In an embodiment, the quantum dot excitation structure is contacted with and covered onto at least one side of the violet LED chip, and a translucent isolating layer is disposed between the quantum dot excitation structure and the violet LED chip and provided for achieving the effects of protecting the translucent isolating layer and facilitating light penetration.

In another embodiment, the quantum dot excitation structure further includes two barrier layers, and the first quantum dot, the second quantum dot and the third quantum dot are stacked and sealed between the two barrier layers to form a thin-film structure, so as to protect and encapsulate the first, second, and third quantum dots by the two barrier layers.

Similarly, the LED lighting structure further has a colloid for encapsulating the violet LED chip, and the quantum dot excitation structure is disposed on an outer side of the colloid.

In another implementation mode, the quantum dot excitation structure is contacted with and covered onto a side of the violet LED chip for directly absorbing the violet light produced by the violet LED chip.

For further protection, the LED lighting device also has a colloid for encapsulating the violet LED chip and the quantum dot excitation structure.

In another embodiment, the quantum dot excitation structure further includes a plurality of barrier layers, and the first quantum dot, the second quantum dot and the third quantum dot are sealed between any two of the barrier layers, so that the barrier layers separate the first, second, and third quantum dots while achieving the protection effect.

Similarly, the LED lighting device further includes a colloid for encapsulating the violet LED chip, and the quantum dot excitation structure is disposed on an outer side of the colloid.

In another implementation mode, the quantum dot excitation structure is contacted and covered onto a side of the violet LED chip for directly receiving the violet light produced by the violet LED chip.

To protect the violet LED chip and the quantum dot excitation structure, the LED lighting device further has a colloid for encapsulating the violet LED chip and the quantum dot excitation structure in an implementation mode.

Preferably, based on the aforementioned embodiments and implementation modes, the base is a flat structure or a cup structure.

In an embodiment, the first quantum dot and a mixing glue are mixed, and the first quantum dot and the mixing glue are mixed in a ratio falling within a range of 1:15-1:18, and preferably 1:17 in order to achieve a better light emitting efficiency.

In a further embodiment, the second quantum dot and a mixing glue are mixed, and the second quantum dot and the mixing glue are mixed in a ratio falling within a range of 1:5-1:8, and preferably 1:7 in order to achieve a better light emitting efficiency.

In an embodiment, the violet light produced by the violet LED chip has a wavelength of 320 nm-400 nm, so that the LED lighting device may use the non-visible ultraviolet light as an exciting light.

In another embodiment, the violet light produced by the violet LED chip has a wavelength of 400 nm-415 nm, so that the LED lighting device may use the visible violet light as an exciting light.

In the aforementioned embodiments and implementation modes, the violet LED chip has a size falling within a range of 100-3660 square millimeters, preferably 700-860 square millimeters based on the consideration of encapsulation, and the violet LED chip has a thickness falling within a range of 130-160 μm.

In an embodiment, the violet light produced by the violet LED chip is situated at the CIE1931 chromaticity coordinates (0.403, 0.426) to provide a better excitation effect. In an embodiment of driving and applying the violet LED chip, the violet LED chip has a forward voltage falling within a range of 1.6-3.4V, and the violet light of the violet LED chip has a full width at half maximum (FWHM) value of the luminous spectrum falling within a range of 14-15 nm, and the violet LED chip has a radiation power falling within a range of 130-230 mW, a peak forward current of 240 mA, and a working temperature falling within a range of −40° C.-125° C.

In another embodiment, the base is made of a material selected from the group consisting of ceramic, aluminum, copper, thermosetting epoxy resin, thermosetting silicone and thermoplastic, and the barrier layers are preferably made of polyethylene terephthalate to provide better flexibility and protection performance. In an embodiment, the colloid is UV glue, silicone, or epoxy resin to provide better heat and oxidation resistance.

In an embodiment of the present invention, an LED lighting device comprises: a base; a violet LED chip, installed at the base, for producing a violet light with a wavelength falling within a range of 320-415 nm; and a quantum dot excitation structure, configured to be corresponsive to the violet LED chip, for absorbing the violet light, for absorbing violet light, and the quantum dot excitation structure including a first quantum dot, a second quantum dot and a third quantum dot, wherein the first quantum dot has a particle size greater than the second quantum dot, and the second quantum dot has a particle size greater than the third quantum dot, and after the first quantum dot absorbs a portion of the violet light, the exciting light has a wavelength falling within a range of 620-660 nm, and after the second quantum dot absorbs a portion of the violet light, the exciting light has a wavelength falling within a range of 510-540 nm, and after the third quantum dot absorbs a portion of the violet light, the exciting light has a wavelength falling within a range of 430-470 nm, and the exciting lights are mixed to form a white light. Therefore, the LED lighting device may use the violet light as an exciting light source to provide a better light emitting efficiency, while preventing human eyes from being harmed by the blue light and providing a better color rendering ability of the output light of the LED lighting device.

Based on the aforementioned embodiment, another embodiment further discloses an LED lighting device further comprising a colloid for encapsulating the violet LED chip, and the first quantum dot, the second quantum dot and the third quantum dot are doped into the colloid to achieve the effect of protecting the violet LED chip and the first quantum dot, the second quantum dot and the third quantum dot. Preferably, the first quantum dot has a unit volume distribution density D1 smaller than the unit volume distribution density D2 of the second quantum dot and the unit volume distribution density D3 of the third quantum dot, or D1<D2; D1<D3 to effectively prevent any refraction that affects the light emitting efficiency.

In an embodiment, the first quantum dot and the colloid are mixed in a ratio falling within a range of 1:15-1:18, and preferably 1:17 in order to obtain a better light emitting efficiency.

In a further embodiment, the second quantum dot and the colloid are mixed in a ratio falling within a range of 1:5-1:8, and preferably 1:7 in order to obtain a better light emitting efficiency.

In an embodiment, the violet light produced by the violet LED chip has a wavelength of 320 nm-400 nm, so that the LED lighting device may use the non-visible ultraviolet light as an exciting light.

In another embodiment, the violet light produced by the violet LED chip has a wavelength of 400 nm-415 nm, so that the LED lighting device may use the visible violet light as an exciting light.

Based on the aforementioned embodiments and implementation modes, the violet LED chip has a size falling within a range of 100-3660 square millimeters, and preferably 700-860 square millimeters for the consideration of encapsulation, and the violet LED chip has a thickness falling within a range of 130-160 μm.

In an embodiment, the violet light produced by the violet LED chip is situated at CIE1931 chromaticity coordinates (0.403, 0.426) to provide a better excitation effect. In an embodiment of driving and applying the violet LED chip, the violet LED chip has a forward voltage falling within a range of 1.6-3.4V, and the violet light of the violet LED chip has a full width at half maximum (FWHM) value of the luminous spectrum falling within a range of 14-15 nm, and the violet LED chip has a radiation power falling within a range of 130-230 mW, a peak forward current equal to 240 mA, and a working temperature falling within a range of −40° C.-125° C.

In another embodiment, the base is preferably a flat structure or a cup structure. Wherein, the base is made of a material selected from the group consisting of ceramic, aluminum, copper, thermosetting epoxy resin, thermosetting silicone and thermoplastic. In an embodiment, the colloid is UV glue, silicone or epoxy resin to provide better heat and oxidation resistance.

In an embodiment of the present invention, an LED lighting device comprises: a base; a violet LED chip, installed at the base, for producing a violet light with a wavelength falling within a range of 320-415 nm; and a quantum dot excitation structure, configured to be corresponsive to the violet LED chip, for absorbing the violet light, and the quantum dot excitation structure including a first quantum dot and a second quantum dot, wherein the first quantum dot has a particle size greater than the second quantum dot, and after the first quantum dot absorbs a portion of the violet light, the exciting light has a wavelength falling within a range of 620-660 nm, and after the second quantum dot absorbs a portion of the violet light, the exciting light has a wavelength falling within a range of 510-540 nm, and the exciting lights are mixed to form a white light. Therefore, the LED lighting device has a high luminous efficiency while preventing human eyes from being harmed by the blue light, and the LED lighting device can be used as a light source provided for being viewed by human eyes for a long time.

Based on the aforementioned embodiment, another embodiment discloses an LED lighting device further comprising a colloid for encapsulating the violet LED chip, and the first quantum dot and the second quantum dot are doped into the colloid to achieve the effect of protecting the violet LED chip and the first quantum dot and the second quantum dot. Preferably, the first quantum dot has a unit volume distribution density D1 smaller than the unit volume distribution density D2 of the second quantum dot to effectively prevent the refraction to affect the light emitting efficiency.

In an embodiment, the first quantum dot and the colloid are mixed in a ratio falling within a range of 1:15-1:18, and preferably 1:17 in order to achieve a better light emitting efficiency.

In a further embodiment, the second quantum dot and the colloid are mixed in a ratio falling within a range of 1:5-1:8, and preferably 1:7 in order to achieve a better light emitting efficiency.

In an embodiment, the violet light produced by the violet LED chip has a wavelength of 320 nm-400 nm, so that the LED lighting device may use the non-visible ultraviolet light as an exciting light.

In another embodiment, the violet light produced by the violet LED chip has a wavelength of 400 nm-415 nm, so that the LED lighting device may use the visible violet light as an exciting light.

Based on the aforementioned embodiments and implementation modes, the violet LED chip has a size falling within a range of 100-3660 square millimeters, and preferably 700-860 square millimeters based on the consideration of encapsulation, and the violet LED chip has a thickness falling within a range of 130-160 μm.

In an embodiment, the violet light produced by the violet LED chip is situated at the CIE1931 chromaticity coordinates (0.403, 0.426) to provide a better excitation effect. In an application of driving the violet LED chip in an embodiment of the present invention, the violet LED chip has a forward voltage falling within a range of 1.6-3.4V, and the violet light of the violet LED chip has a full width at half maximum (FWHM) value of the luminous spectrum falling within a range of 14-15 nm, and the violet LED chip has a radiation power falling within a range of 130-230 mW, a peak forward current of 240 mA, and a working temperature falling within a range of −40° C.-125° C.

In another embodiment, the base is preferably a flat structure or a cup structure. Wherein, the base is made of a material selected from the group consisting of ceramic, aluminum, copper, thermosetting epoxy resin, thermosetting silicone and thermoplastic. In an embodiment, the colloid is UV glue, silicone or epoxy resin to provide a better heat and oxidation resistance.

In an embodiment of the present invention, an LED lighting device comprises: a base; a violet LED chip, installed at the base, for producing a violet light with a wavelength falling within a range of 320-415 nm; a blue LED chip, installed at the base for producing a blue light and arranged parallel to the violet LED chip, and the blue light of the blue LED chip having a wavelength falling within a range of 420-440 nm, wherein the violet LED chip is a primary excitation source, and the blue LED chip is a secondary excitation source; a quantum dot excitation structure, configured to be corresponsive to the violet LED chip and the blue LED chip, for absorbing the violet light and the blue light, and the quantum dot excitation structure including a first quantum dot and a second quantum dot, wherein the first quantum dot has a particle size greater than the second quantum dot, and after the first quantum dot absorbs a portion of the violet light and a portion of the blue light, the exciting light has a wavelength falling within a range of 620-660 nm, and after the second quantum dot absorbs a portion of the violet light and a portion of the blue light, the exciting light has a wavelength falling within a range of 510-540 nm, and the exciting lights are mixed to form a white light. Therefore, the invention uses the violet LED chip as the primary excitation source and the blue LED chip as the secondary excitation source structure, so that the LED lighting device is capable of providing high luminous efficiency and effectively preventing human eyes from being harmed by the blue light, while the blue LED chip can improve the overall color rendering ability.

Based on the aforementioned embodiment, another embodiment discloses an LED lighting device further comprising a colloid for encapsulating the violet LED chip and the blue LED chip, and the first quantum dot and the second quantum dot are doped into the colloid to achieve the effect of protecting the violet LED chip, the blue LED chip, the first quantum dot and the second quantum dot. Alternatively, the colloid is provided for encapsulating the violet LED chip and the blue LED chip, and the first quantum dot I doped into the colloid, and the second quantum dot is disposed on an outer side of the colloid. Preferably, the first quantum dot has a unit volume distribution density D1 smaller than the unit volume distribution density D2 of the second quantum dot to effectively prevent any refraction that may affect the light emitting efficiency.

In an embodiment, the first quantum dot and the colloid are mixed in a ratio falling within a range of 1:15-1:18, and preferably 1:17 in order to achieve a better light emitting efficiency.

In a further embodiment, the second quantum dot and the colloid are mixed in a ratio falling within a range of 1:5-1:8, and preferably 1:7 in order to achieve a better light emitting efficiency.

In an embodiment, the violet light produced by the violet LED chip has a wavelength of 320 nm-400 nm, so that the LED lighting device may use the non-visible ultraviolet light as an exciting light.

In another embodiment, the violet light produced by the violet LED chip has a wavelength of 400 nm-415 nm, so that the LED lighting device may use the visible violet light as an exciting light.

Based on the aforementioned embodiments and implementation modes, the violet LED chip has a size falling within a range of 100-3660 square millimeters, and preferably 700-860 square millimeters for the consideration of encapsulation, and the violet LED chip has a thickness falling within a range of 130-160 μm.

In an embodiment, the violet light of the violet LED chip is situated at the CIE1931 chromaticity coordinates (0.403, 0.426) to provide a better excitation effect. In an application of driving the violet LED chip in accordance with an embodiment, the violet LED chip has a forward voltage falling within a range of 1.6-3.4V, and the violet light of the violet LED chip has a full width at half maximum (FWHM) value of the luminous spectrum falling within a range of 14-15 nm, and the violet LED chip has a radiation power falling within a range of 130-230 mW, a peak forward current of 240 mA, and a working temperature falling within a range of −40° C.-125° C.

In another embodiment, the base is preferably a flat structure or a cup structure. Wherein, the base is made of a material selected from the group consisting of ceramic, aluminum, copper, thermosetting epoxy resin, thermosetting silicone and thermoplastic. In an embodiment, the colloid is UV glue, silicone or epoxy resin to provide a better heat and oxidation resistance.

In summation, the LED lighting device of present invention gives away the design of using the blue chip as the exciting light source, but using the violet LED chip together with the quantum dot excitation structure instead, so as to improve the light emitting efficiency of the LED lighting device and prevent human eyes from being harmed by the blue light, and further improve the color rendering ability to meet the high color rendering requirement. Compared with the traditional way of using the blue light as the exciting light source, the invention uses the violet light as the exciting light source to obtain higher brightness and better light emitting efficiency while preventing human eyes from being harmed by the blue light. With the special configuration of the quantum dot excitation structure, the low conversion efficiency caused by the light secondary absorption can be prevented effectively, and the wavelength of the light excited and produced by the quantum dots can be stabilized to prevent the light color deviation, so as to provide a stable and accurate white light. In various different implementation modes of the LED lighting device based on different factors, the structure of the invention can achieve the effects of further improving the light emitting efficiency of the LED lighting device, preventing human eyes from being harmed by the blue light, and enhancing the light color.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DESCRIPTION OF THE PREFERRED EMBODIMENTS

The above and other objects, features and advantages of this disclosure will become apparent from the following detailed description taken with the accompanying drawings.

Figure 1A:
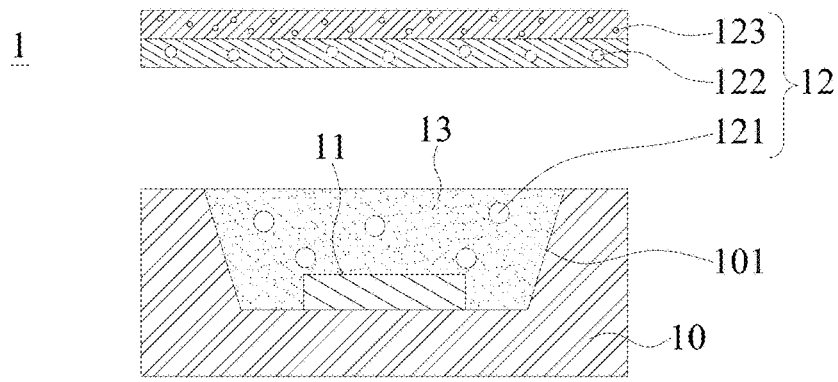
FIG. 1A is a sectional view showing a first implementation mode of a first preferred embodiment of the present invention.
Figure 1B:
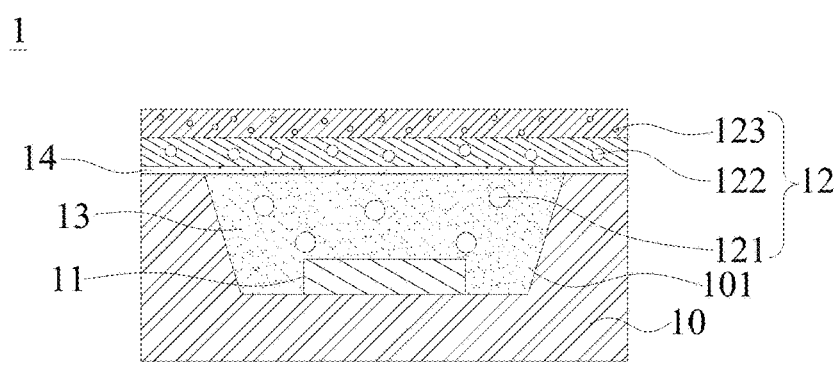
FIG. 1B is a sectional view showing a second implementation mode of the first preferred embodiment of the present invention.
Figure 1C:
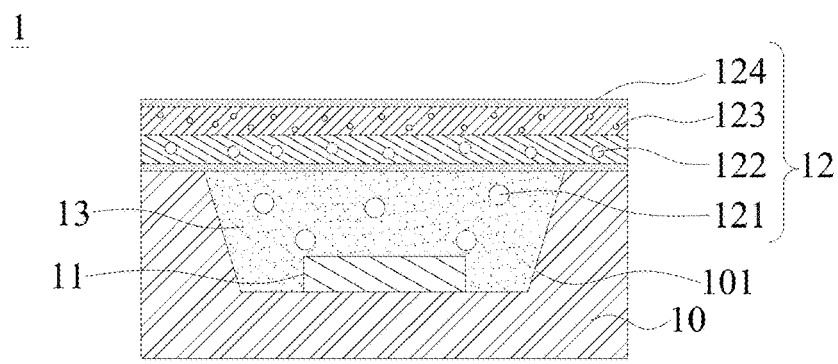
FIG. 1C is a sectional view showing a third implementation mode of the first preferred embodiment of the present invention.

With reference to FIGS. 1A, 1B and 1C for the first implementation mode, second implementation mode and third implementation mode of an LED lighting device 1 in accordance with the first embodiment of the present invention respectively, the LED lighting device 1 comprises a base 10, a violet LED chip 11 and a quantum dot excitation structure 12. The base 10 is provided for carrying the violet LED chip 11, and the base 10 may be a flat structure or a cup structure made of a material selected from ceramic, aluminum, copper, thermosetting epoxy resin, thermosetting silicone or thermoplastic, etc. In this embodiment, the base 10 is a cup structure with a groove 101. The violet LED chip 11 is installed at the base 10 for producing a violet light, and the violet light has a wavelength falling within a range of 320-415 nm. Wherein, the violet light includes a visible violet light or an invisible ultraviolet (UV) light. In practical applications, the violet light produced by the violet LED chip 11 preferably has a wavelength falling within a range of 320 nm-400 nm, which is usually called the invisible ultraviolet light (UV). Alternatively, the violet light produced by the violet LED chip 11 has a wavelength of 400 nm-415 nm, which is usually called a visible violet light. In other words, the LED lighting device 1 may use the visible violet light or invisible ultraviolet light as a light source for exciting the quantum dot excitation structure 12, so that the LED lighting device 1 has an excellent light emitting efficiency.

The quantum dot excitation structure 12 is installed and configured to be corresponsive to the violet LED chip 11 for absorbing the aforementioned violet light, and the quantum dot excitation structure 12 includes a first quantum dot 121, a second quantum dot 122 and a third quantum dot 123, wherein the first quantum dot 121 has a particle size greater than the second quantum dot 122, and the second quantum dot 122 has a particle size greater than the third quantum dot 123, and the first quantum dot 121 has a unit volume distribution density D1 smaller than the unit volume distribution density D2 of the second quantum dot 122, and the unit volume distribution density D3 of the third quantum dot 123, or D1<D2; D1<D3, and the first quantum dot 121 and the violet LED chip 11 have a relative distance L1 smaller than the relative distance L2 between the second quantum dot 122 and the violet LED chip 11 and the third quantum dot 123 and the violet LED chip 11 have a relative distance L3, or L1<L2; L1<L3. After the violet light produced by the violet LED chip 11 is transmitted to the quantum dot excitation structure 12, and the first quantum dot 121 absorbs a portion of the violet light, the exciting light has a wavelength falling within a range of 620-660 nm, and after the second quantum dot 122 absorbs a portion of the violet light, the exciting light has a wavelength falling within a range of 510-540 nm, and after the third quantum dot 123 absorbs a portion of the violet light, the exciting light has a wavelength falling within a range of 430-470 nm, and the exciting lights are mixed to form a white light. Wherein, the first quantum dot 121, the second quantum dot 122 and third quantum dot 123 are made of a material selected from CdSe, CdSe/ZnS, core-shell CdSe or CdSe/ZnS, InP or InP/ZnS, CdSexTe1-x or ZnxCd1-xSe etc and synthesized with a translucent glue to form gel quantum dots.

The quantum dot of the present invention refers to a zero-dimensional semiconductor nano crystal, and if the particle size is smaller than a specific size, a light with a specific wavelength is excited and produced by the size effect, so as to produce a unique difference, and the property of the quantum dot is determined mainly by the factors including size, defectiveness, crystallization and passivation, and these factors ay affect the quantum efficiency and light emitting wavelength of the quantum dots. When the quantum dots are excited by external energy, electrons jump from the ground state to the excited state, so that both electrons and holes have a higher energy, and then the electrons and holes may be combined again to release their energy to a lower energy state, and finally return to the ground state. During the recombination and energy releasing processes, energy will be released by the radiation or irradiation of photons. The property of outputting light by the quantum dots is controlled by the selection of an appropriate material and the size of nano crystals. If the excited energy received by the quantum dots is higher than its energy gap and the electrons jump to a specific energy band, and the conduction-band electrons and valence-band holes can be combined again to output light, and such direct recombination is called "band edge" recombination, and shows the unique property of the quantum dots with a quantum confinement effect. Therefore, quantum dots may adjust its energy gap by adjusting the particle size in order to change the wavelength of the outputted light. In optical applications, the quantum dots made of the same material and manufactured in different particle sizes may be used to excite lights with different wavelengths.

If the quantum dot crystal structure has a defective surface, the electrons and holes are grabbed by the defective surface after the quantum dots receive the excitation energy, and then recombined in the defective surface. Now, the wavelength of the radiating light will be deviated, so that the surface of the quantum dots and the defective surface have critical impact on the light output property of the quantum dots, and an appropriate surface status is an essential factor for the quantum dots to have a high luminous efficiency. If the quantum dot has a large specific surface area, the electron quantum state and surface state has substantial impact on its optical property. When the specific surface area of the quantum dot is large, the high surface energy state density may affect the optical absorption, quantum efficiency, light output intensity, spectral position, and fluorescent excitation of the quantum dot. To improve the surface energy state, a surface passivation method is generally used to improve the optical property of the quantum dot. In the surface passivation method, an organic or inorganic compound is covered onto a surface of the quantum dot, so that the unbound structure of the surface of the quantum dot is passivated completely, and it will not exist in the surface energy state, and the impact on the light outputting property of the quantum dot may be reduced or minimized. Since the quantum dot may use a single material and a different size together with energy to excite various different wavelengths of light, therefore the quantum dot has the advantages of high quantum efficiency, controllable radiation wavelength, narrow FWHM spectrum of the exciting light, and wide wavelength of exciting light, etc. The inventor of the present invention uses quantum dots instead of phosphor to develop the LED lighting device 1 of the invention, and also effectively overcome the drawbacks of the light secondary absorption and low light emitting efficiency.

To improve the light emitting efficiency of the LED lighting device 1 and the expression of the white light, a specific control of the specific wavelength of the light is applied, and the inventor of the present invention adopts the violet LED chip 11 and uses the violet light to excite the quantum dot excitation structure 12 to emit lights falling within the range of the aforementioned wavelengths, and the required white light can be obtained by mixing the exciting lights. Compared with the conventional blue LED, the violet light together with the quantum dot are used to achieve a high luminous efficiency and prevent human eyes from being harmed by the blue light. In present LED applications, a high energy visible light with a specific wavelength may cause macular leision to human eyes. The visible light having a relatively large impact to the eyes has a wavelength falling within a range of 415-455 nm, and such light is usually called blue light, and the exciting light used in the conventional LED is blue light, and when the conventional white light is mixed by the blue light together with the red and green phosphor or quantum dots, the blue light acting as the exciting light will affect the overall light emitting efficiency and the light color expression of the white light once if the intensity is reduced. This is exactly the common problem of the present display white light LED displays and illumination lamps that remains unsolved. In the LED lighting device 1 of the present invention, the violet light is used as the exciting light. Since the blue light is excited by the third quantum dot 123 but not provided directly by the violet LED chip 11, therefore the concentration of the third quantum dot 123 may be adjusted and controlled in order to control the specific weight of the blue light to be mixed to form the final white light. The selection of the violet LED chip 11 is one of the important factors of the present invention. Even if the LED uses the conventional blue light for excitation, the intensity of the blue light may be reduced to stop or prevent the mixed white light that may harm human eyes, but such arrangement will give rise to another issue of insufficient light emitting efficiency, and the red and green phosphor or quantum dots may be used and must be adjusted synchronously, so that a light color deviation of the white light may be occurred easily. On the other hand, the LED lighting device 1 of the present invention simply requires a slight adjustment of concentration of the third quantum dot 123 to effectively adjust the specific light intensity, so that the outputted light maintains its high color rendering. In the LED lighting device 1 of this embodiment, the invention gives away the conventional LED design concept of using a single blue LED chip as the exciting light source and achieves the effects of providing high luminous efficiency and high color rendering ability and preventing the blue light from harming human eyes.

The issue of the secondary absorption usually encountered in the quantum dot excitation structure 12 can be overcome by the limitation of the relative distance and the design of the quantum dot concentration. When the quantum dot has a relatively larger particle size, the light absorbed by the quantum dot has a broader range of wavelengths. On the other hand, when the quantum dot has a particle relatively smaller size, the light absorbed by the quantum dot has a smaller range of wavelengths. The larger the wavelength of light, the smaller the unit energy of the light. In the present invention, the first quantum dot 121 with a larger particle size is installed proximate to the violet LED chip 11, so that the light excited and produced by the second quantum dot 122 and the third quantum dot 123 with a smaller particle size and a specific range of wavelengths will not be absorbed by the first quantum dot 121. When the light excited and produced by the first quantum dot 121 and the violet light are transmitted to the second quantum dot 122 and the third quantum dot 123, the second quantum dot 122 and the third quantum dot 123 just absorb the violet light of higher energy but will not absorb the light excited and produced by the first quantum dot 121 to effectively stop the secondary absorption and prevent the low light emitting efficiency and limit the unit volume distribution density of the first quantum dot 121 of the LED lighting device 1 to be smaller than those of the second quantum dot 122 and the third quantum dot 123 to achieve the effect of improving the overall light emitting performance. Specifically, the unit volume distribution density of the first quantum dot 121 refers to the number of particles per unit volume being smaller than the number of particles per unit volume of the second quantum dot 122 and the third quantum dot 123, and this method can reduce the consumption of light caused by the refraction. In other words, the number of particles of the first quantum dot 121 can be reduced, so that the probability of the light being refracted by the first quantum dot 121 with a larger particle size is reduced, and the first quantum dot 121 with a larger particle size is installed proximate to the violet LED chip 11, so as to overcome the light secondary absorption and effectively prevent the violet light transmitted to the second quantum dot 122 and the third quantum dot 123 being affected by the first quantum dot 121 with a larger particle size or resulting in a diffusion and a failure of the light absorption and achieve the effect of improving the utilization of the violet light.

In this embodiment, the LED lighting device 1 further comprises a colloid 13 for encapsulating the violet LED chip 11, and the first quantum dot 121 is doped into the colloid 13, and the second quantum dot 122 and the third quantum dot 123 are installed on an outer side of the colloid 13. In FIG. 1A, the first quantum dot 121 with a larger particle size is doped into the colloid 13, and the violet LED chip 11 is encapsulated into the base 10 by the colloid 13, and the colloid 13 has the effect of protecting the violet LED chip 11 and the first quantum dot 121 to prevent the issues of humidity and oxidation. Preferably, the colloid 13 is made of UV glue, silicone or epoxy resin to further prevent the first quantum dot 121 and the violet LED chip 11 from being affected by humidity or oxidation to improve the protection performance.

In FIG. 1B, a translucent isolating layer 14 is disposed between the second quantum dot 122 and the third quantum dot 123 and the colloid 13 to facilitate the excitation of the violet light and the first quantum dot 121 to produce a light penetration while preventing heat energy from affecting the second quantum dot 122 and the third quantum dot 123. In FIG. 1C, the second quantum dot 122 and the third quantum dot 123 are sealed between two barrier layers 124 to form a thin-film structure, and preferably, the second quantum dot 122 and the third quantum dot 123 are stacked in layers and encapsulated in the two barrier layers 124. The two barrier layers 124 are provided for protecting the second quantum dot 122 and the third quantum dot 123 to achieve the effects of isolating heat energy and resisting humidity, so as to prevent color change and brightness reduction, wherein the two barrier layers 124 may be made of polyethylene terephthalate or any other equivalent thin translucent material with a thickness smaller than the thickness of the second quantum dot 122 and the thickness of the third quantum dot 123. It is noteworthy that the second quantum dot 122 and the third quantum dot 123 are contacted with the cup structured base 10, or separated with a distance from the base 10. In FIGS. 1A-1C, the second quantum dot 122 and the third quantum dot 123 are installed in layers, but the invention is not limited to such structure only, and the second quantum dot 122 and the third quantum dot 123 may be mixed to form a single-layer structure.

In addition, the violet LED chip 11 has a size preferably falling within a range of 100-3660 square millimeters, and preferably 700-860 square millimeters for the consideration of the level of difficulty of encapsulation, the total volume of the LED lighting device 1, and the brightness of the violet LED chip 11 to prevent a too-large area that may affect the encapsulation and a too-small total volume or area of the LED lighting device 1 that may cause poor brightness and low light emitting efficiency. In addition, the thickness of the violet LED chip 11 is also limited, and preferably falls within a range of 130-160 μm. Preferably, the violet light produced by the violet LED chip 11 with a better application condition is situated at the CIE1931 chromaticity coordinates (0.403, 0.426), and the violet LED chip 11 has a forward voltage falling within a range of 1.6-3.4V, and preferably 3.32V. The violet light of the violet LED chip 11 has a full width at half maximum (FWHM) value of the luminous spectrum falling within a range of 14-15 nm, and the violet LED chip 11 has a radiation power falling within a range of 130-230 mW, a peak forward current of 240 mA, and a working temperature falling within a range of −40° C.-125° C. With the aforementioned application conditions, the LED lighting device 1 provides better light output efficiency.

Figure 2A:
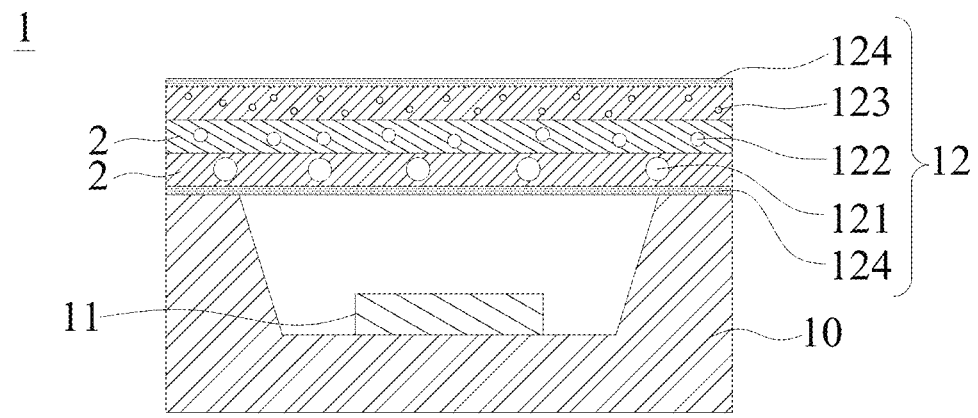
FIG. 2A is a sectional view showing a first implementation mode of a second preferred embodiment of the present invention.
Figure 2B:
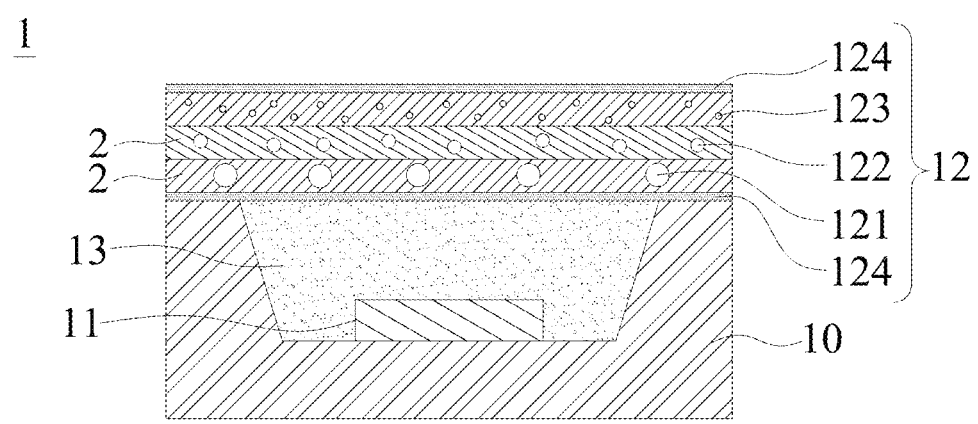
FIG. 2B is a sectional view showing a second implementation mode of the second preferred embodiment of the present invention.

With reference to FIGS. 2A and 2B for the schematic views of the first and second implementation modes in accordance with the second embodiment of the present invention respectively, this embodiment is substantially the same as the first embodiment except that the quantum dot excitation structure 12 of the LED lighting device 1 further comprises two barrier layers 124, and the first quantum dot 121, the second quantum dot 122 and the third quantum dot 123 are stacked and sealed between the two barrier layers 124 to form a thin-film structure. The invention can further prevent the first quantum dot 121, the second quantum dot 122 and the third quantum dot 123 from being affected by external ambient moisture, or the material from being oxidized to affect the wavelength of the excited light or the light color of the LED lighting device 1 from being deviated. In addition, the quantum dot excitation structure 12 achieves the effects of preventing heat energy from affecting the operation of the violet LED chip 11, effectively isolating the heat energy from causing poor color change and low brightness of the quantum dots, and simplifying the manufacturing procedure. In another implementation mode of this embodiment as shown in FIG. 2B, the LED lighting device 1 further comprises the colloid 13 for encapsulating the violet LED chip 11, and the quantum dot excitation structure 12 installed on an outer side of the colloid 13 for protecting the violet LED chip 11, and preventing the permeation of moisture from the air or affecting the light color and the light emitting efficiency. Similarly, the colloid 13 is made of UV glue, silicone or epoxy resin. In this embodiment, the first quantum dot 121 is preferably mixed with a mixing glue 2, and the first quantum dot 121 and the mixing glue 2 are mixed in a ratio falling within a range of 1:15-1:18, and preferably 1:17 in order to provide a the best excitation efficiency. The second quantum dot 122 is mixed with a mixing glue 2, and the second quantum dot 122 and the mixing glue 2 are mixed in a ratio falling within a range of 1:5-1:8, and preferably 1:7 in order to achieve the best excitation efficiency.

Figure 3A:
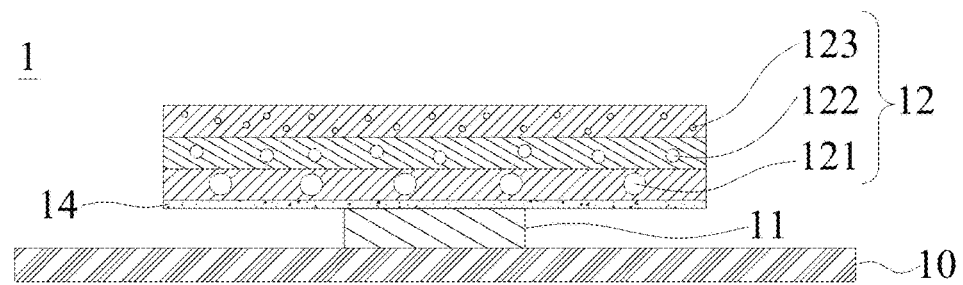
FIG. 3A is a sectional view showing a first implementation mode of a third preferred embodiment of the present invention.

With reference to FIGS. 3A, 3B, 3C and 3D for the first to fourth implementation modes of the third embodiment of the present invention respectively, this embodiment is substantially the same as the previous embodiments, except that the quantum dot excitation structure 12 of the implementation mode as shown in FIG. 3A is contacted with and covered onto at least one side of the violet LED chip 11, and the first quantum dot 121, the second quantum dot 122 and the third quantum dot 123 are stacked, and a translucent isolating layer 14 is disposed between the quantum dot excitation structure 12 and the violet LED chip 11 and preferably made of resin, and the base 10 is a flat structure. It is noteworthy to mention that the quantum dot excitation structure 1 may be covered onto a light output side of the violet LED chip 11 as shown in FIG. 3A or covered onto different surfaces of the violet LED chip 11 in an arc form, and the translucent isolating layer 14 is disposed between the quantum dot excitation structure 12 and the violet LED chip 11 for preventing heat energy from affecting the wavelength of the light excited and produced by the quantum dot excitation structure 12 when the violet LED chip 11 is operated or affecting the overall light output efficiency and color.

Figure 3B:
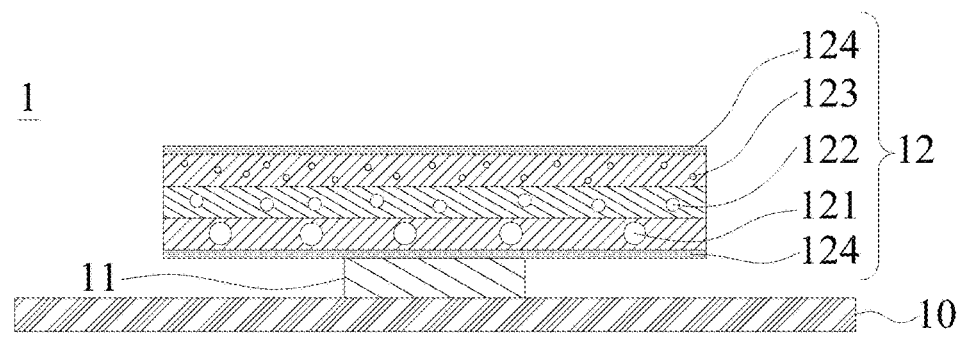
FIG. 3B is a sectional view showing a second implementation mode of the third preferred embodiment of the present invention.
Figure 3C:
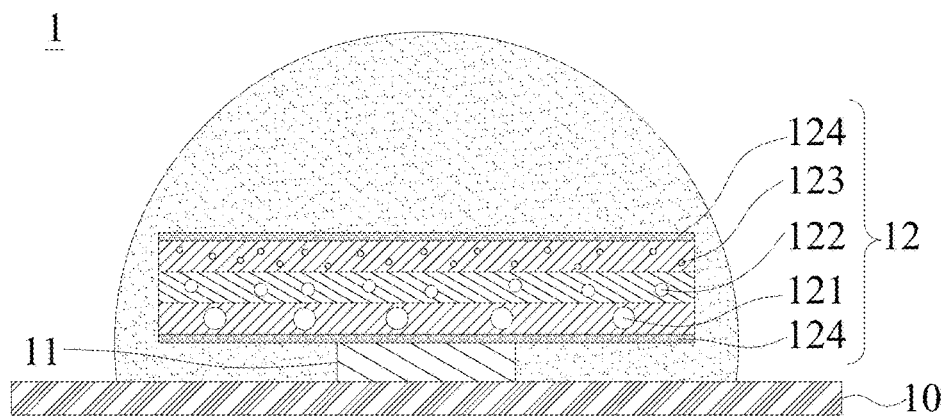
FIG. 3C is a sectional view showing a third implementation mode of the third preferred embodiment of the present invention.
Figure 3D:
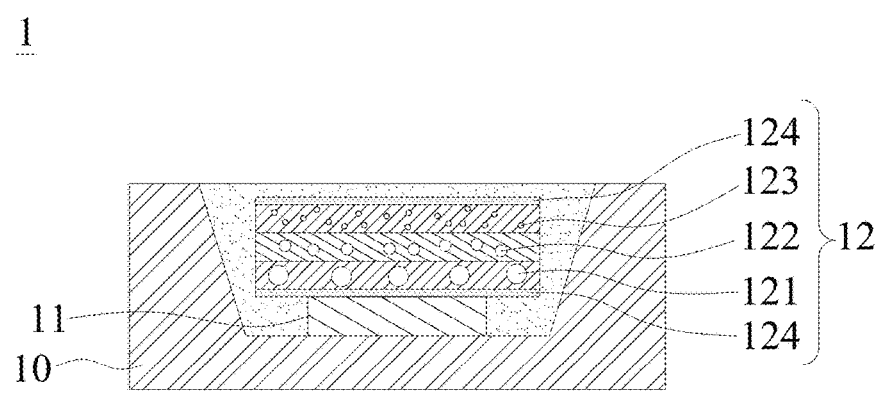
FIG. 3D is a sectional view showing a fourth implementation mode of the third preferred embodiment of the present invention.

In FIG. 3B, the quantum dot excitation structure 12 is also contacted with and covered onto at least one side of the violet LED chip 11 for directly receiving the light of the violet LED chip 11, and further improving the utilization of the violet light. The quantum dot excitation structure 12 further includes two barrier layers 124, and the first quantum dot 121, the second quantum dot 122 and the third quantum dot 123 are stacked and sealed between the two barrier layers 124 to form a thin-film structure. In FIG. 3C, the LED lighting device 1 uses the colloid 13 for encapsulating the violet LED chip 11 and the quantum dot excitation structure 12 to achieve the effects of protecting the violet LED chip 11 and the quantum dot excitation structure 12, and preventing moisture from affecting the violet LED chip 11 or oxidizing the quantum dot excitation structure 12, and affecting the light emitting efficiency and the light color. If the base 10 has a cup structured groove 101, the structure is contacted and covered as shown in FIG. 3D.

Figure 4A:
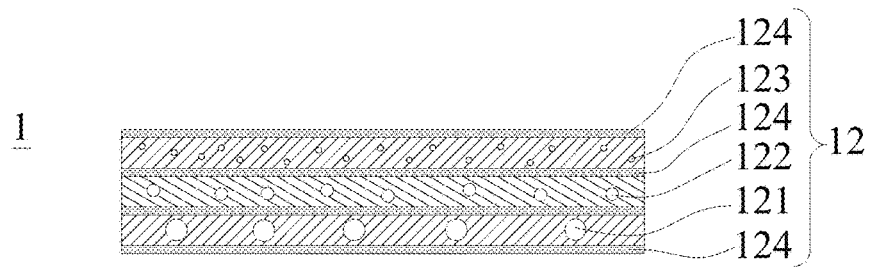
FIG. 4A is a sectional view showing a first implementation mode of a fourth preferred embodiment of the present invention.
Figure 4B:
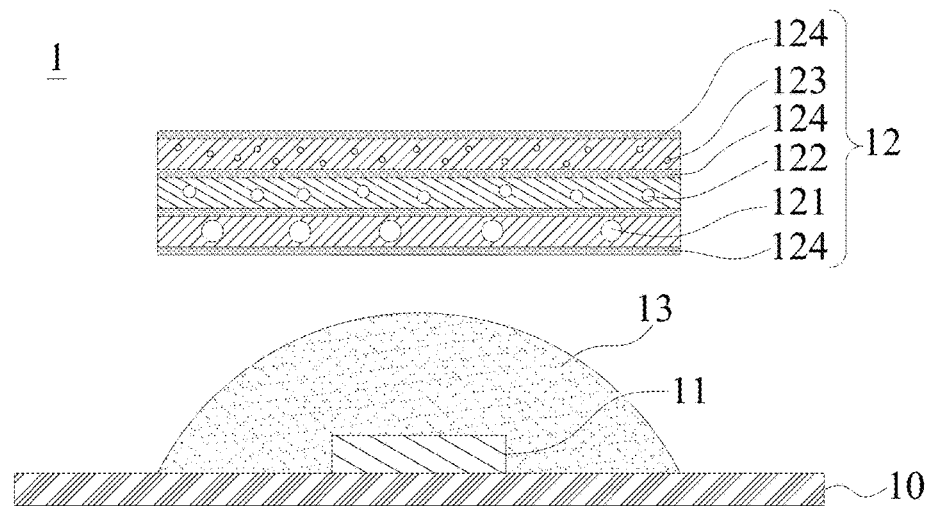
FIG. 4B is a sectional view showing a second implementation mode of the fourth preferred embodiment of the present invention.

With reference to FIGS. 4A and 4B for the schematic views of the first and second implementation modes in accordance with the fourth embodiment of the present invention respectively, this embodiment is substantially the same as those of the previous embodiment except that the quantum dot excitation structure 12 of this embodiment further includes a plurality of barrier layers 124, and the first quantum dot 121, the second quantum dot 122 and the third quantum dot 123 are sealed between any two of the barrier layers 124. In other words, the barrier layer 124 is disposed between the first quantum dot 121, the second quantum dot 122 and the third quantum dot 123, and the first quantum dot 121, the second quantum dot 122 and the third quantum dot 123 are stacked with the barrier layers 124 to form the quantum dot excitation structure 12. With the barrier layers 124, the first quantum dot 121, the second quantum dot 122 and the third quantum dot 123 can be protected to prevent ambient humidity from affecting their excitation efficiency and status. In FIG. 4B, the LED lighting structure 1 uses the colloid 13 to encapsulate the violet LED chip 11, and the quantum dot excitation structure 12 is disposed on an outer side of the colloid for protecting the violet LED chip 11, and preventing the permeation of moisture from air or the adverse impact on the light color and light emitting efficiency.

Figure 5A:
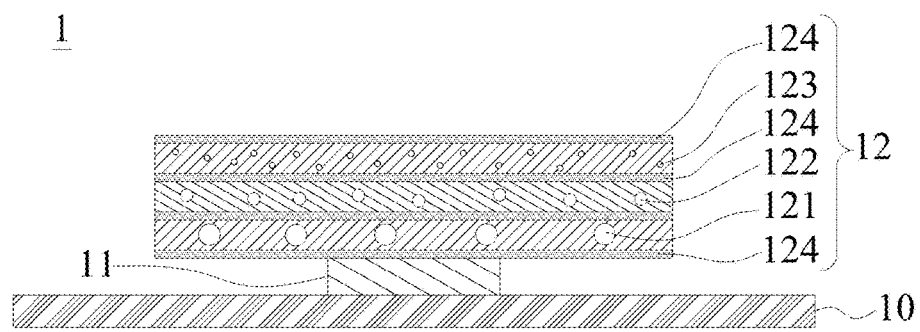
FIG. 5A is a sectional view showing a third implementation mode of the fourth preferred embodiment of the present invention.
Figure 5B:
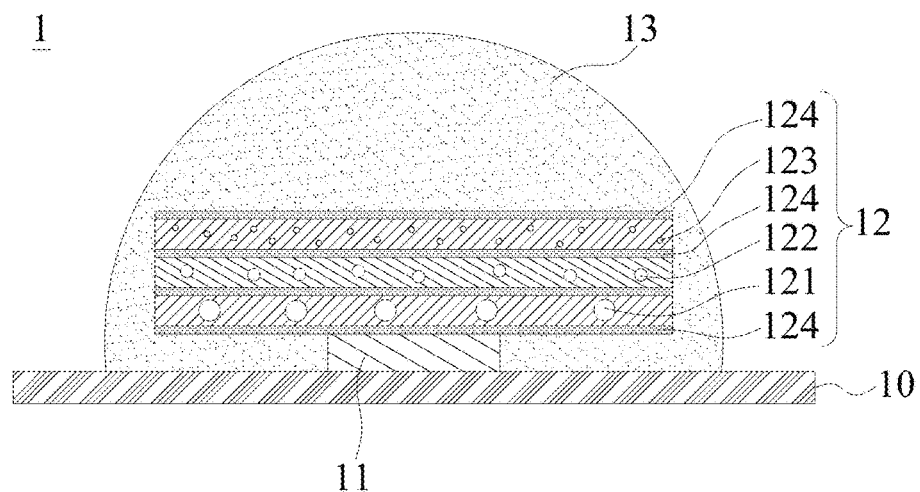
FIG. 5B is a sectional view showing a fourth implementation mode of the fourth preferred embodiment of the present invention.

With reference to FIGS. 5A and 5B for the third and fourth implementation modes in accordance with the fourth embodiment of the present invention respectively, the first quantum dot 121, the second quantum dot 122 and the third quantum dot 123 of the third implementation mode of the fourth embodiment are also sealed between any two of the barrier layers 124 to form a thin-film quantum dot excitation structure 12, and the quantum dot excitation structure 12 is contacted with and covered onto a side of the violet LED chip 11 as shown in FIG. 5A, but the quantum dot excitation structure 12 may be covered onto different surfaces of the violet LED chip 11 in an arc form. Therefore, the first quantum dot 121, the second quantum dot 122 and the third quantum dot 123 can directly receive the violet light produced by the violet LED chip 11 and absorb and excite and produce lights of different wavelengths, and the exciting lights are mixed to form the required white light. In FIG. 5B, the LED lighting device 1 also has the colloid 13 for encapsulating the violet LED chip 11 and the quantum dot excitation structure 12 to achieve the protection effect. Similarly, the colloid 13 is made of UV glue, epoxy resin or silicone.

Figure 6A:
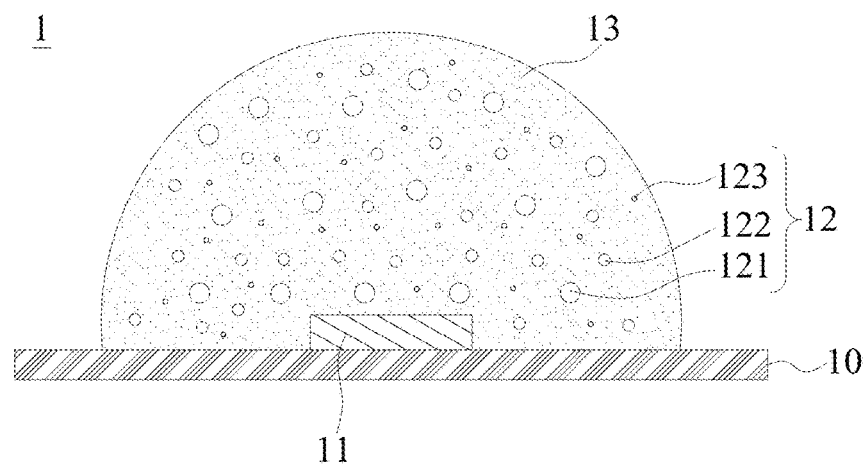
FIG. 6A is a first sectional view of a fifth preferred embodiment of the present invention.
Figure 6B:
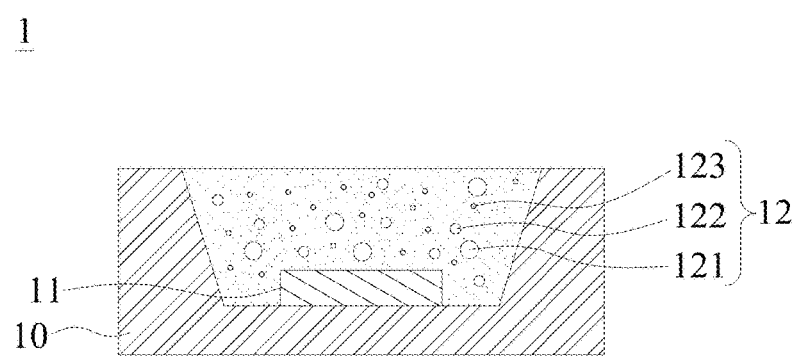
FIG. 6B is a second sectional view of the fifth preferred embodiment of the present invention.
Figure 7:
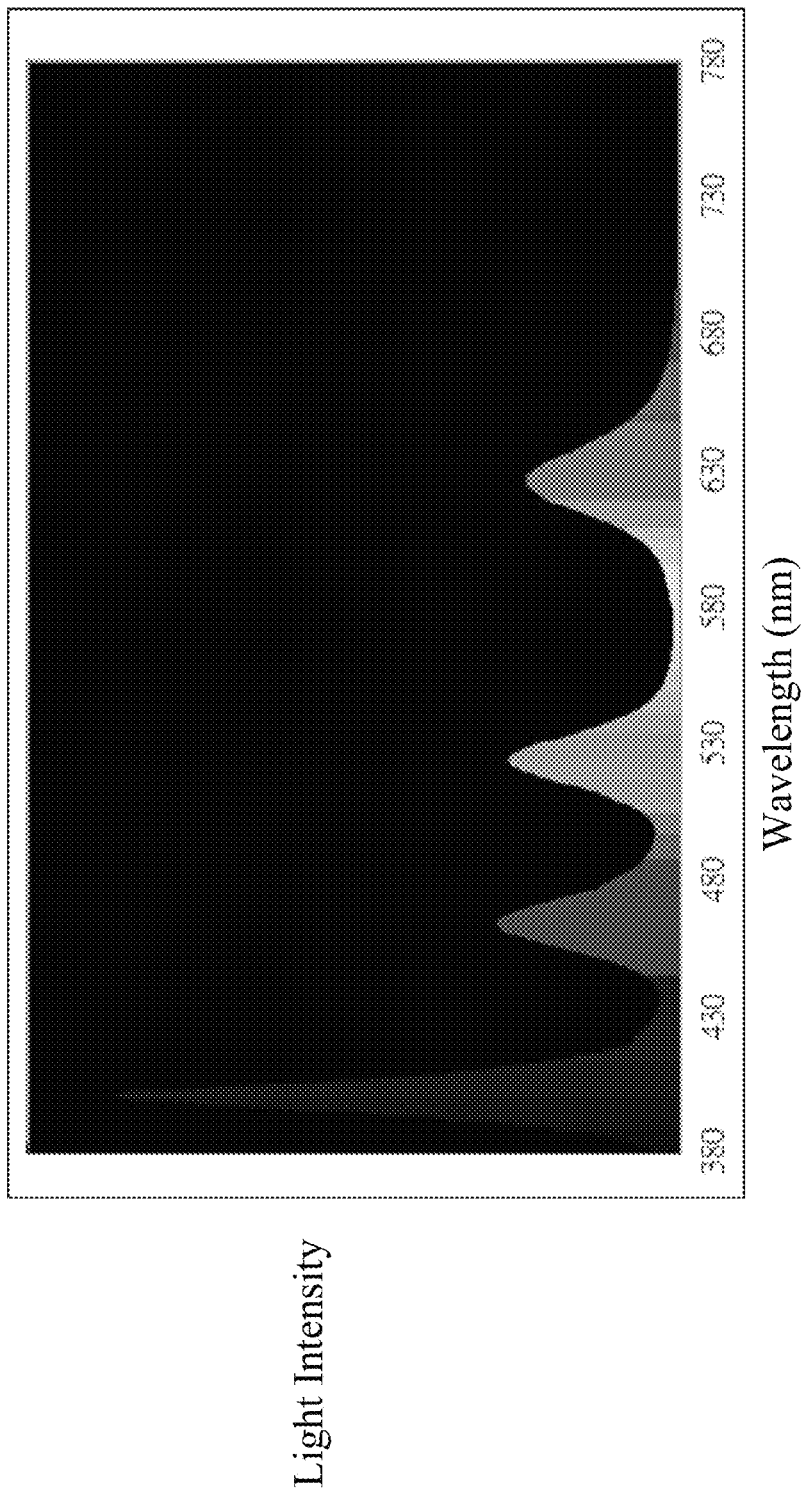
FIG. 7 is a luminous spectrum of an LED lighting device in accordance with the fifth preferred embodiment of the present invention.

With reference to FIGS. 6A, 6B and 7 for the sectional views and the luminous spectrum of the fifth embodiment of the present invention respectively, an LED lighting device 1 of the present invention comprises a base 10, a violet LED chip 11 and a quantum dot excitation structure 12. The violet LED chip 11 is installed at the base 10 for producing a violet light with a wavelength falling within a range of 320 nm-415 nm, and the quantum dot excitation structure 12 is configured to be corresponsive to the violet LED chip 11 and provided for absorbing the violet light, and the quantum dot excitation structure 12 includes a first quantum dot 121, a second quantum dot 122 and a third quantum dot 123, wherein the first quantum dot 121 has a particle size greater than the second quantum dot 122, and the second quantum dot 122 has a particle size greater than the third quantum dot 123, and after the first quantum dot 121 absorbs a portion of the violet light, the exciting light has a wavelength falling within a range of 620-660 nm, and after the second quantum dot 122 receives a portion of the violet light, the exciting light has a wavelength falling within a range of 510-540 nm, and after the third quantum dot 123 receives a portion of the violet light, the exciting light has a wavelength falling within a range of 430-470 nm, and the exciting lights are mixed to form a white light. Therefore, the quantum dot excitation structure 12 can mix the exciting lights to form a white light through the excitation of the violet light, and the LED lighting device 1 has an excellent color rendering ability. As described above, the violet light is used as an exciting light source and provided for the LED lighting device 1 to achieve a better light emitting efficiency. In the LED lighting device 1 of this embodiment, the invention gives away the LED design concept of using an independent blue LED chip as the exciting light source to achieve the effects of providing high luminous efficiency and color rendering ability and preventing human eyes from being harmed by blue light. Wherein, the LED lighting device 1 has a luminous spectrum as shown in FIG. 7.

Preferably, the LED lighting device 1 further has a colloid 13 for encapsulating the violet LED chip 11, and the first quantum dot 121, the second quantum dot 122 and the third quantum dot 123 are doped into the colloid 13. Therefore, the first quantum dot 121, the second quantum dot 122 and the third quantum dot 123 effectively receive the violet light of the violet LED chip 11 and excite the violet light to form a light with the aforementioned wavelength, and the lights are mixed to form the required white light.

To improve the overall light emitting efficiency of the LED lighting device 1, the first quantum dot 121 has a unit volume distribution density D1 smaller than the unit volume distribution density D2 of the second quantum dot 122 and the unit volume distribution density D3 of the third quantum dot 123 (or D1<D2; D1<D3) to prevent the light produced by the first quantum dot 121 with a larger particle size from being refracted. In this embodiment, the first quantum dot 121 and the colloid 13 are mixed in a ratio falling within a range of 1:15-1:18, and preferably 1:17 in order to provide the best excitation efficiency. The second quantum dot and the colloid 13 are mixed in a ratio falling within a range of 1:5-1:8, and preferably 1:7 in order to achieve the best excitation efficiency.

Similarly, the violet light of the violet LED chip 11 of the LED device 1 has a wavelength preferably falling within a range of 320 nm-400 nm, and the invisible ultraviolet light may be used to excite the quantum dot excitation structure 12, so that the LED lighting device 1 can provide a white light. Alternatively, the violet light of the violet LED chip 11 of the LED lighting device 1 has a wavelength preferably falling within a range of 400 nm-415 nm, and the visible violet light is used to excite the quantum dot excitation structure 12. The violet LED chip 11 has a size falling within a range of 100-3660 square millimeters. With the consideration the factors including the level of difficulty of the encapsulation, the total volume of the LED lighting device 1, and the brightness of the violet LED chip, the violet LED chip 11 preferably has an area of 700-860 square millimeters to prevent a too-large area that may affect the encapsulation and a too-small total volume or area of the LED lighting device 1 that may cause poor brightness and low light emitting efficiency. The violet LED chip 11 has a thickness preferably falling within a range of 130-160 µm. In addition, the violet LED chip 11 with a better application condition produces a violet light situated at the CIE1931 chromaticity coordinates (0.403, 0.426), and the violet LED chip 11 has a forward voltage falling within a range of 1.6-3.4V, preferably 3.32V; and the violet light of the violet LED chip 11 has a full width at half maximum (FWHM) value of the luminous spectrum falling within a range of 14-15 nm, and the violet LED chip 11 has a radiation power falling within a range of 130-230 mW, a peak forward current of 240 mA, and a working temperature falling within a range of −40° C.-125° C. Based on the aforementioned application conditions, the LED lighting device 1 provides better light output efficiency.

In addition, the base 10 is a flat structure or a cup structure, wherein the base 10 in the flat structure is shown in 6A, and the base 10 in the cup structure is shown in FIG. 6B. The base 10 is made of ceramic, aluminum, copper, thermosetting epoxy resin, thermosetting silicone or thermoplastic to provide better rigidity and heat dissipation performance. With the consideration of the level of difficulty of encapsulation of the LED lighting device 1, and the impact on the quantum dot excitation structure 12 and the violet LED chip 11, the colloid 13 is preferably made of UV glue, silicone or epoxy resin.

Figure 8A:
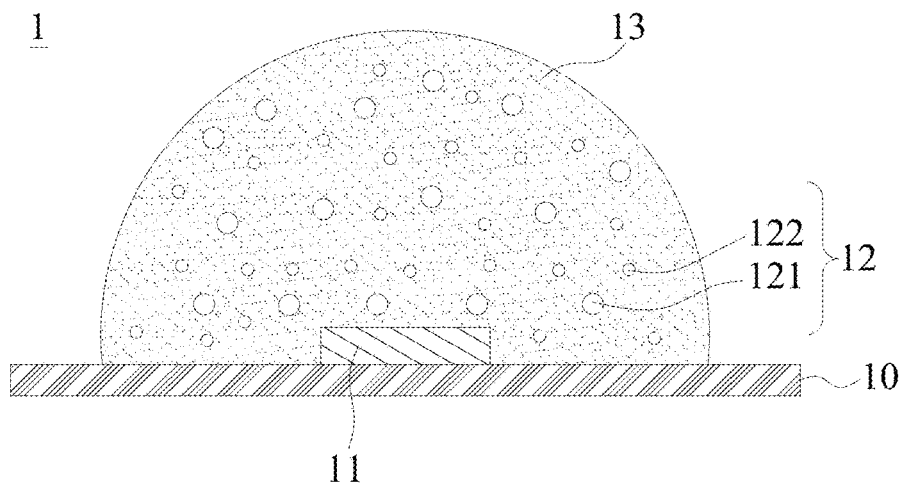
FIG. 8A is a first sectional view of a sixth preferred embodiment of the present invention.
Figure 8B:
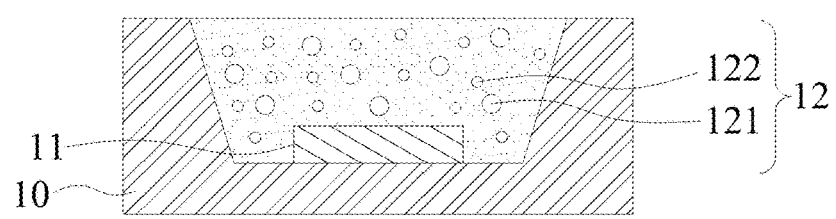
FIG. 8B is a second sectional view of the sixth preferred embodiment of the present invention.
Figure 9:
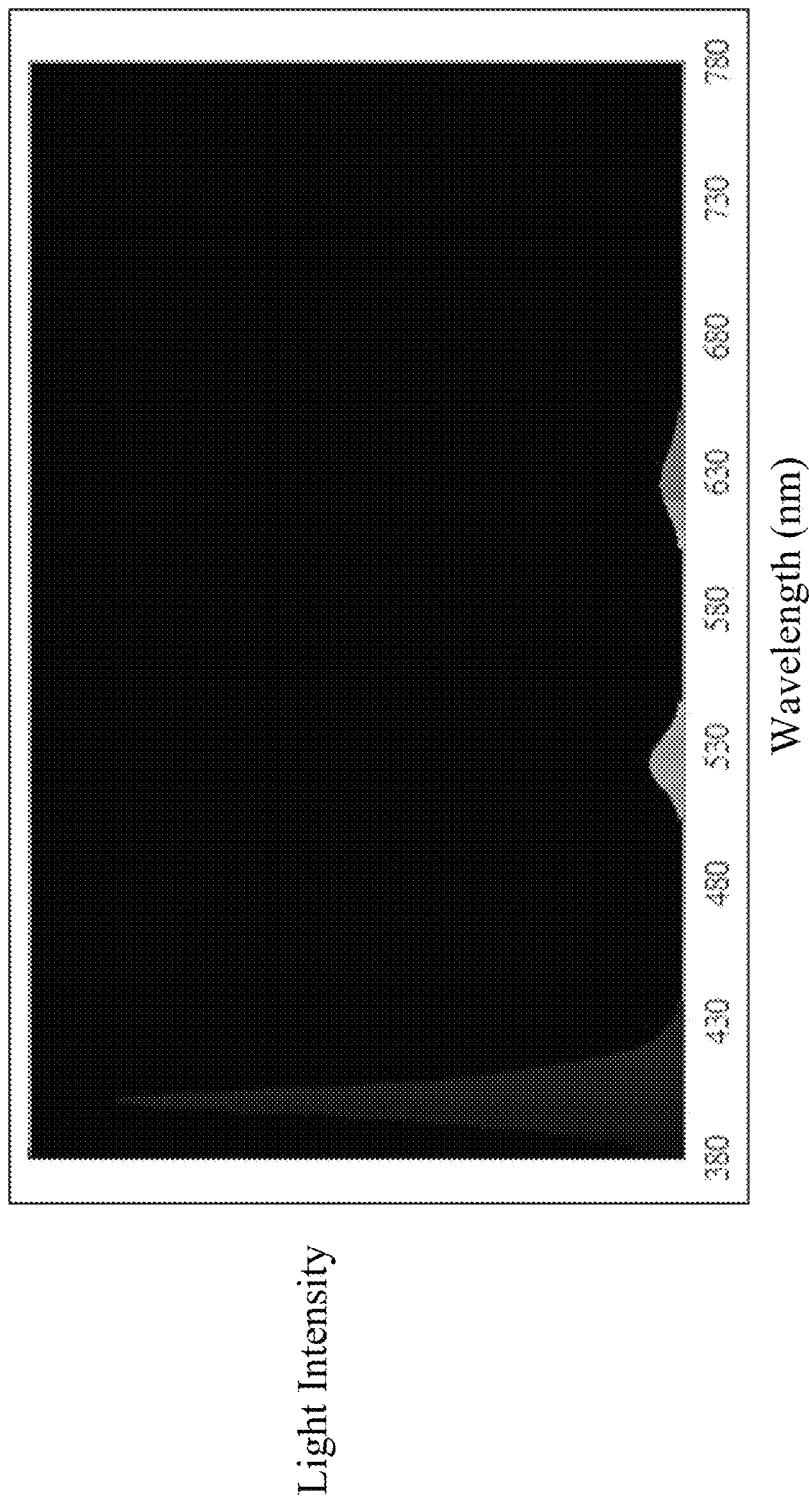
FIG. 9 is a luminous spectrum of an LED lighting device in accordance with the sixth preferred embodiment of the present invention.

With reference to FIGS. 8A, 8B and 9 for the sectional views and the luminous spectrum of the sixth embodiment of the present invention respectively, the LED lighting device 1 of this embodiment comprises a base 10, a violet LED chip 11 and a quantum dot excitation structure 12. The violet LED chip 11 is installed at the base 10 for producing a violet light with a wavelength falling within a range of 320 nm-415 nm, and the quantum dot excitation structure 12 is configured to be corresponsive to the violet LED chip 11 for absorbing the violet light, and the quantum dot excitation structure 12 comprises a first quantum dot 121 and a second quantum dot 122, wherein the first quantum dot 121 has a particle size greater than the second quantum dot 122, and after the first quantum dot 121 absorbs a portion of the violet light, the exciting light has a wavelength falling within a range of 620-660 nm, and after the second quantum dot 122 receives a portion of the violet light, the exciting light has a wavelength falling within a range of 510-540 nm, and the exciting lights are mixed to form a white light. It is noteworthy to mention that when the LED lighting device 1 is provided as a light source for human eyes for a long time, the light with a wavelength falling within a range of 415 nm-455 nm is usually called blue light, which may cause a pathological change of human eyes, so that it is an important design direction for reducing the quantity of light with the aforementioned wavelengths. Therefore, the LED lighting device 1 of this embodiment gives away the design of using the blue light as the exciting light source to achieve the effect of projecting a light completely without any light of the aforementioned wavelength, and the invention is applicable for the light source for human eyes for a long time of use without harming human health, while maintaining a high luminous efficiency, a high luminous efficiency and preventing human eyes from being harmed by the blue light.

Preferably, the LED lighting device 1 further has a colloid 13 for encapsulating the violet LED chip 11, and the first quantum dot 121 and the second quantum dot 122 are doped into the colloid 13, and the colloid 13 is provided for encapsulating and protecting the violet LED chip 11 and the quantum dot excitation structure 12, so that the quantum dot excitation structure 12 can effectively excite the violet light produce a light with the aforementioned wavelength, and the LED lighting device 1 has a luminous spectrum as shown in FIG. 9.

To improve the overall light emitting efficiency of the LED lighting device 1, the first quantum dot 121 has a unit volume distribution density D1 smaller than the unit volume distribution density D2 of the second quantum dot 122 to prevent the first quantum dot 121 with a larger particle size from increasing the probability of scattering refraction. In this embodiment, the first quantum dot 121 and the colloid 13 are mixed in a ratio falling within a range of 1:15-1:18, and preferably 1:17 in order to provide the best excitation efficiency. The second quantum dot and the colloid 13 are mixed in a ratio falling within a range of 1:5-1:8, and preferably 1:7 in order to provide the best excitation efficiency.

Similarly, the violet light of the violet LED chip 11 of the LED lighting device 1 has a wavelength preferably falling within a range of 320 nm-400 nm, and the invisible ultraviolet light is used to excite the quantum dot excitation structure 12, so that the LED lighting device 1 can provide a white light. Alternatively, the violet light of the violet LED chip 11 of the LED lighting device 1 has a wavelength preferably falling within a range of 400 nm-415 nm, and the visible violet light is used to excite the quantum dot excitation structure 12. The violet LED chip 11 has a size falling within a range of 100-3660 square millimeters. With the consideration of the level of difficulty of the encapsulation, the total volume of the LED lighting device 1 and the brightness of the violet LED chip 11, the violet LED chip 11 preferably has an area of 700-860 square millimeters prevent a too-large area that may affect the encapsulation and a too-small total volume or area of the LED lighting device that may cause poor brightness and low light emitting efficiency, and the violet LED chip 11 has a thickness preferably falling within a range of 130-160 µm. In a better application condition of the violet LED chip 11, the violet light produced by the violet LED chip 11 is situated at the CIE1931 chromaticity coordinates (0.403, 0.426), and the violet LED chip 11 has a forward voltage falling within a range of 1.6-3.4V, preferably 3.32V; and the violet light of the violet LED chip 11 has a full width at half maximum (FWHM) value of the luminous spectrum falling within a range of 14-15 nm, and the violet LED chip 11 has a radiation power falling within a range of 130-230 mW, a peak forward current of 240 mA, and a working temperature falling within a range of −40° C.-125° C.

In addition, the base 10 is a flat structure or a cup structure, wherein the base 10 in the flat structure is shown in FIG. 8A and the base 10 in the cup structure is shown in FIG. 8B. The base 10 is made of ceramic, aluminum, copper, thermosetting epoxy resin, thermosetting silicone or thermoplastic to provide better rigidity and heat dissipation performance. With the consideration of the level of difficulty of encapsulation of the LED lighting device 1, and the impact on the quantum dot excitation structure 12 and the violet LED chip 11, the colloid is preferably made of UV glue, silicone or epoxy resin.

Figure 10A:
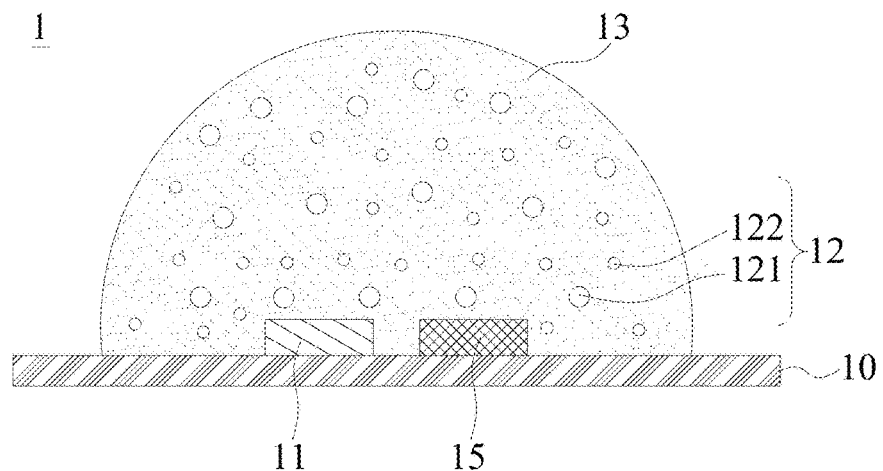
FIG. 10A is a first sectional view of a seventh preferred embodiment of the present invention.
Figure 10B:
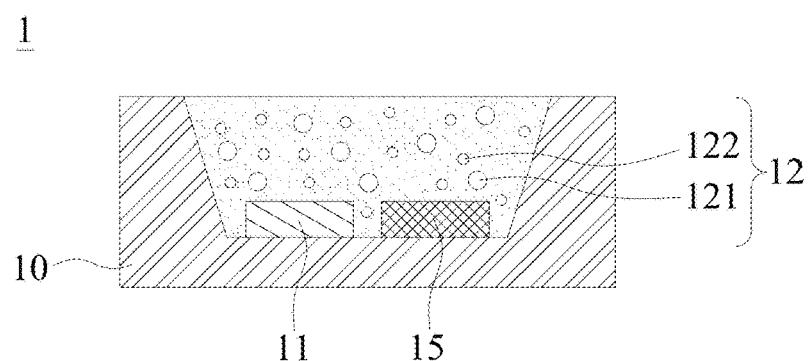
FIG. 10B is a second sectional view of the seventh preferred embodiment of the present invention.
Figure 10C:
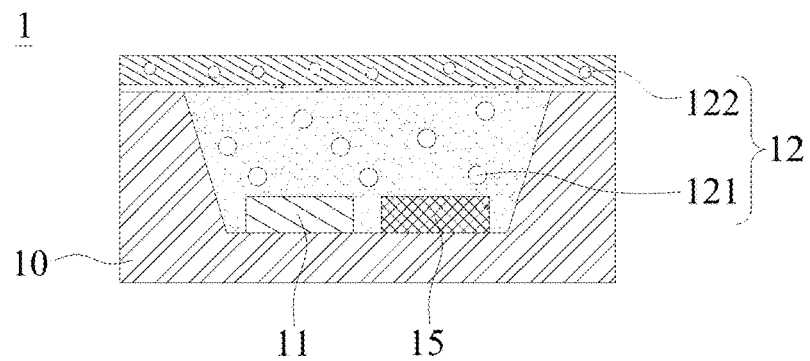
FIG. 10C is a sectional view of the eighth preferred embodiment of the present invention.
Figure 11:
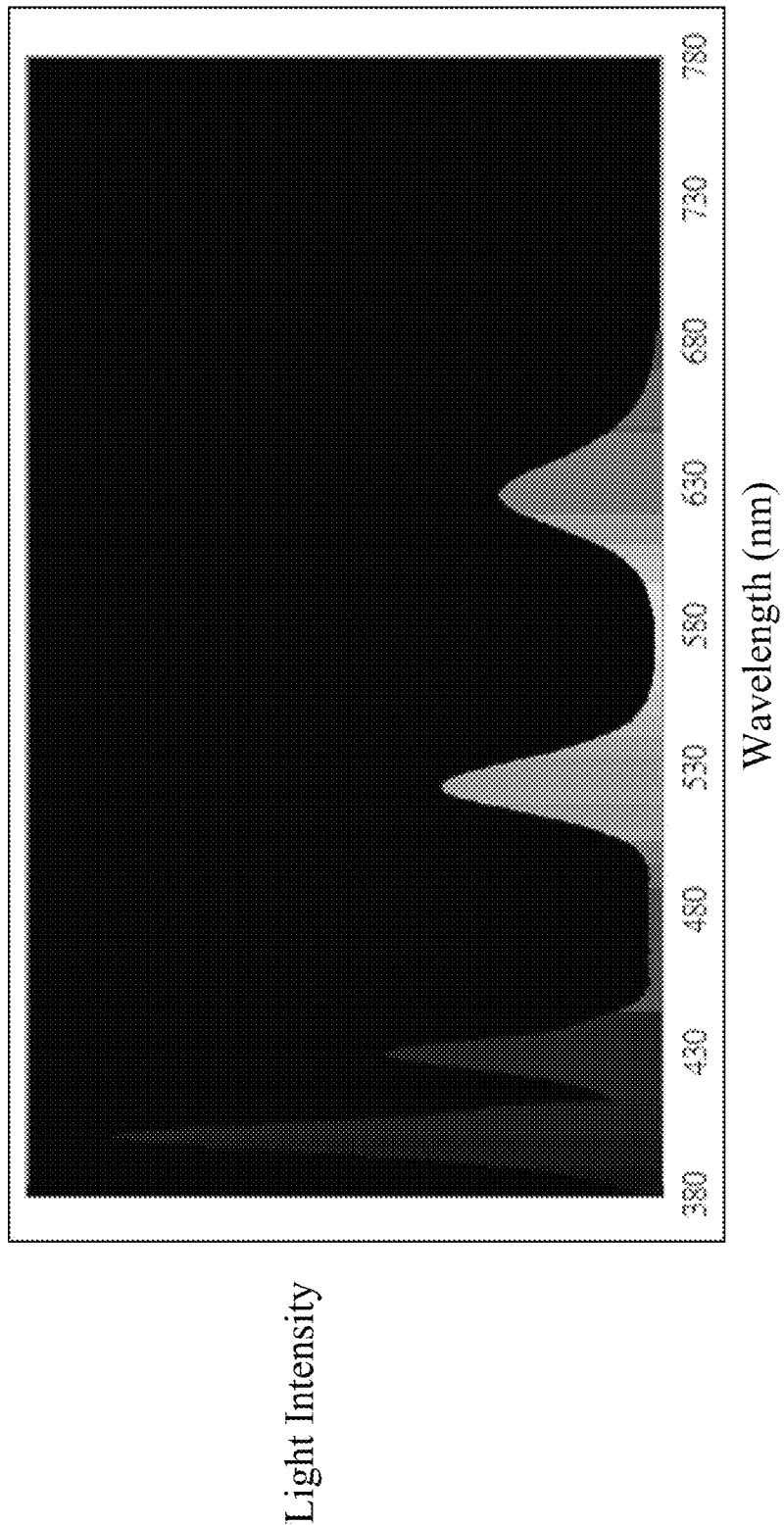
FIG. 11 is a luminous spectrum of an LED lighting device in accordance with the seventh preferred embodiment of the present invention.

With reference to FIGS. 10A, 10B and 11 for the sectional views and luminous spectrum of the seventh embodiment of the present invention respectively, the LED lighting device 1 of this embodiment comprises a base 10, a violet LED chip 11, a blue LED chip 15 and a quantum dot excitation structure 12. The violet LED chip 11 is installed at the base 10 for producing a violet light with a wavelength falling within a range of 320 nm-415 nm, and the blue LED chip 15 is installed at the base 10 and arranged parallel to the violet LED chip 11, and the blue LED chip 15 has a blue light with a wavelength falling within a range of 420-440 nm, wherein the violet LED chip 11 is a primary excitation source, and the blue LED chip 15 is a secondary excitation source. The quantum dot excitation structure 12 is configured to be corresponsive to the violet LED chip 11 and the blue LED chip 15 for absorbing the violet light and the blue light, and the quantum dot excitation structure 12 produces a light excited by the violet LED chip 11, and the quantum dot excitation structure 12 includes a first quantum dot 121 and a second quantum dot 122, wherein the first quantum dot 121 has a particle size greater than the second quantum dot 122, and after the first quantum dot 121 receives a portion of the violet light and a portion of the blue light, the exciting light has a wavelength falling within a range of 620-660 nm, and after the second quantum dot 122 receives a portion of the violet light and a portion of the blue light, the exciting light has a wavelength falling within a range of 510-540 nm, and the exciting lights are mixed to form a white light. Therefore, the LED lighting device 1 has high color rendering ability and light emitting efficiency. It is noteworthy to mention that the quantum dot excitation structure 12 mainly uses the violet light as the exciting light to provide a better excitation efficiency, and the blue light is used to excite the light of the quantum dot excitation structure 12 and also play the rote of improving the color rendering ability of the LED lighting device 1. In a display device requiring a high color rendering requirement, it is very important for the LED lighting device 1 to have a white light color rendering ability. In the LED lighting device 1 of this embodiment, the invention gives away the design of using the blue chip as the exciting light source, but using the violet LED chip together with the quantum dot excitation structure instead, so as to improve the light emitting efficiency of the LED lighting device and prevent human eyes from being harmed by the blue light, and further improve the color rendering ability to meet the high color rendering requirement, and the LED lighting device 1 has a luminous spectrum as shown in FIG. 11. Preferably, the LED lighting device 1 has a colloid 13 for encapsulating the violet LED chip 11 and the blue LED chip 15, and the first quantum dot 121 and the second quantum dot 122 are doped into the colloid 13, and the colloid 13 is provided for encapsulating and protecting the violet LED chip 11, the blue LED chip 15 and the quantum dot excitation structure 12, so that the quantum dot excitation structure 12 can effectively produce a light excited by the violet light and a portion of the blue light and having the aforementioned wavelength, and the LED lighting device 1 has a luminous spectrum as shown in FIG. 11. Alternatively, the colloid 13 is provided for encapsulating the violet LED chip 11 and the blue LED chip 15, and the first quantum dot 121 is doped into the colloid 13, and the second quantum dot 122 is disposed on an outer side of the colloid 13, and the first quantum dot 121 and the second quantum dot 122 are doped into the colloid 13. Wherein, the first quantum dot 121 has a unit volume distribution density D1 smaller than the unit volume distribution density D2 of the second quantum dot 122 to prevent the first quantum dot 121 with a larger particle size to increase the probability of scattering refraction. In this embodiment, the first quantum dot 121 and the colloid 13 are mixed in a ratio falling within a range of 1:15-1:18, and preferably 1:17 in order to provide the best excitation efficiency. The second quantum dot and the colloid 13 are mixed in a ratio falling within a range of 1:5-1:8, and preferably 1:7 in order to achieve the best excitation efficiency.

Similarly, the violet light produced by the violet LED chip 11 of the LED lighting device 1 has a wavelength preferably falling within a range of 320 nm-400 nm, and the invisible ultraviolet light may be used to excite the quantum dot excitation structure 12, so that the LED lighting device 1 can provide a white light. Alternatively, the violet light produced by the violet LED chip 11 of the LED lighting device 1 has a wavelength preferably falling within a range of 400 nm-415 nm, and the visible violet light is used to excite the quantum dot excitation structure 12. The violet LED chip 11 has a size falling within a range of 100-3660 square millimeters. With the considerations of the level of difficulty of the encapsulation, the total volume of the LED lighting device 1, and the brightness of the violet LED chip, the violet LED chip 11 preferably has an area of 700-860 square millimeters to prevent a too-large area that may affect the encapsulation and a too-small total volume or area of the LED lighting device 1 that may cause poor brightness and low light emitting efficiency. In addition, the thickness of the violet LED chip 11 is also limited, and preferably falls within a range of 130-160 μm. The violet LED chip with a better application condition produces a violet light situated at the CIE1931 chromaticity coordinates (0.403, 0.426), and the violet LED chip has a forward voltage falling within a range of 1.6-3.4V, and preferably 3.32V; the violet light of the violet LED chip has a full width at half maximum (FWHM) value of the luminous spectrum falling within a range of 14-15 nm, and the violet LED chip has a radiation power falling within a range of 130-230 mW, a peak forward current of 240 mA, and a working temperature falling within a range of −40° C.-125° C.

In addition, the base 10 is a flat structure or a cup structure, wherein the base 10 in the flat structure is shown in FIG. 10A and the base 10 in the cup structure is shown in FIG. 10B. The base 10 is made of ceramic, aluminum, copper, thermosetting epoxy resin, thermosetting silicone or thermoplastic to provide better rigidity and heat dissipation performance. With the consideration of the level of difficulty of encapsulation of the LED lighting device 1, and the impact on the quantum dot excitation structure 12 and the violet LED chip 11, the colloid is preferably made of UV glue, silicone or epoxy resin.

In summation of the description, the LED lighting device of the present invention gives away the design of using the blue chip as the exciting light source, but using the violet LED chip together with the quantum dot excitation structure instead, so as to improve the light emitting efficiency of the LED lighting device and prevent human eyes from being harmed by the blue light, and further improve the color rendering ability to meet the high color rendering requirement. Compared with the traditional way of using the blue light as the exciting light source, the invention uses the violet light as the exciting light source to obtain higher brightness and better light emitting efficiency while preventing human eyes from being harmed by the blue light. With the special configuration of the quantum dot excitation structure, the low conversion efficiency caused by the light secondary absorption can be prevented effectively, and the wavelength of the light excited and produced by the quantum dots can be stabilized to prevent the light color deviation, so as to provide a stable and accurate white light, and the specific wavelength light may be adjusted. In different implementation modes of the LED lighting device, the invention has the effects of improving the light emitting efficiency and light color of the LED lighting device and eliminating the possibility of harming human eyes by blue light.

What is claimed is:

1. An LED lighting device, comprising:
   a base;
   a violet LED chip, installed at the base, for producing a violet light with a wavelength falling within a range of 320-415 nm; and
   a quantum dot excitation structure, configured to be corresponsive to the violet LED chip, for absorbing the violet light, and the quantum dot excitation structure including a first quantum dot, a second quantum dot and a third quantum dot, wherein the first quantum dot has a particle size greater than the second quantum dot, and the second quantum dot has a particle size greater than the third quantum dot, and the first quantum dot has an unit volume distribution density D1 smaller than an unit volume distribution density D2 of the second quantum dot, and an unit volume distribution density D3 of the third quantum dot, or D1<D2; D1<D3, and a distance L1 between the first quantum dot and the violet LED chip is smaller than a distance L2 between the second quantum dot and the violet LED chip, and a distance L3 between the third quantum dot and the violet LED chip, or L1<L2; L1<L3, and the first quantum dot emits a light having a wavelength falling within a range of 620-660 nm after absorbing a portion of the violet light, the second quantum dot emits a light having a wavelength falling within a range of 510-540 nm after absorbing a portion of the violet light, the third quantum dot emits a light having a wavelength falling within a range of 430-470 nm after absorbing a portion of the violet light, and lights emitted by the first quantum dot, the second quantum dot, the third quantum dot are mixed to form a white light.

2. The LED lighting device of claim 1, further comprising a colloid, for encapsulating the violet LED chip, and the first quantum dot being doped into the colloid, and the second quantum dot and the third quantum dot being disposed on the outer side of the colloid.

3. The LED lighting device of claim 2, wherein the second quantum dot and the third quantum dot have a translucent isolating layer disposed adjacent to the colloid.

4. The LED lighting device of claim 2, wherein the second quantum dot and the third quantum dot are sealed between two barrier layers to form a thin-film structure.

5. The LED lighting device of claim 1, wherein the quantum dot excitation structure further includes two barrier layers, and the first quantum dot, the second quantum dot and the third quantum dot are stacked and sealed between the two barrier layers to form a thin-film structure.

6. The LED lighting device of claim 5, further comprising a colloid, for encapsulating the violet LED chip, and the quantum dot excitation structure being disposed on an outer side of the colloid.

7. The LED lighting device of claim 5, wherein the quantum dot excitation structure is contacted with and covered onto a side of the violet LED chip.

8. The LED lighting device of claim 7, further comprising a colloid, for encapsulating the violet LED chip and the quantum dot excitation structure.

9. The LED lighting device of claim 1, wherein the quantum dot excitation structure further comprises a barrier layer, and the first quantum dot, the second quantum dot and the third quantum dot are sealed between any two of the barrier layers.

10. The LED lighting device of claim 9, further comprising a colloid, for encapsulating the violet LED chip, and the quantum dot excitation structure being disposed on an outer side of the colloid.

11. The LED lighting device of claim 9, wherein the quantum dot excitation structure is contacted with and covered onto a side of the violet LED chip.

12. The LED lighting device of claim 11, further comprising a colloid, for encapsulating the violet LED chip and the quantum dot excitation structure.

13. The LED lighting device of claim 1, wherein the quantum dot excitation structure is contacted with and covered on at least one side of the violet LED chip, and a translucent isolating layer is disposed between the quantum dot excitation structure and the violet LED chip.

14. The LED lighting device of claim 1, wherein the base is a flat structure or a cup structure.

15. The LED lighting device of claim 2, wherein the first quantum dot is mixed with a mixing glue, and the first quantum dot and the mixing glue are mixed with a ratio falling within a range of 1:15-1:18.

16. The LED lighting device of claim 15, wherein the first quantum dot and the mixing glue are preferably mixed in a ratio of 1:17.

17. The LED lighting device of claim 5, wherein the second quantum dot is mixed with a mixing glue, and the second quantum dot and the mixing glue are mixed with a ratio falling within a range of 1:5-1:8.

18. The LED lighting device of claim 17, wherein the second quantum dot and the mixing glue are preferably mixed in a ratio of 1:7.

19. The LED lighting device of claim 1, wherein the violet light produced by the violet LED chip has a wavelength of 320 nm-400 nm.

20. The LED lighting device of claim 1, wherein the violet light produced by the violet LED chip has a wavelength of 400 nm-415 nm.

21. The LED lighting device of claim 1, wherein the violet LED chip has a size falling within a range of 100-3660 square mil.

22. The LED lighting device of claim 21, wherein the violet LED chip has a size preferably equal to 700-860 square mil.

23. The LED lighting device of claim 1, wherein the violet LED chip emits a violet light situated at the CIE1931 chromaticity coordinates (0.403, 0.426).

24. The LED lighting device of claim 1, wherein the violet LED chip has a forward voltage falling within a range of 1.6-3.4V.

25. The LED lighting device of claim 1, wherein the violet LED chip has a violet light with a full width at half maximum (FWHM) value of its luminous spectrum falling within a range of 14-15 nm.

26. The LED lighting device of claim 1, wherein the violet LED chip has a radiation power falling within a range of 130-230 mW.

27. The LED lighting device of claim 1, wherein the violet LED chip has a peak forward current of 240 mA.

28. The LED lighting device of claim 1, wherein the violet LED chip has a thickness falling within a range of 130-160 μm.

29. The LED lighting device of claim 1, wherein the violet LED chip has a working temperature falling within a range of −40° C.-125° C.

30. The LED lighting device of claim 1, wherein the base is made of a material selected from the group consisting of ceramic, aluminum, copper, thermosetting epoxy resin, thermosetting silicone and thermoplastic.

31. The LED lighting device of claim 4, wherein the barrier layer is made of polyethylene terephthalate.

32. The LED lighting device of claim 2 wherein the colloid is one selected from the group consisting of UV glue, silicone, and epoxy resin.

* * * * *